US009613666B1

(12) United States Patent
Koh et al.

(10) Patent No.: US 9,613,666 B1
(45) Date of Patent: Apr. 4, 2017

(54) SEMICONDUCTOR DEVICES AND SEMICONDUCTOR SYSTEMS INCLUDING THE SAME

(71) Applicant: SK hynix Inc., Icheon-si, Gyeonggi-do (KR)

(72) Inventors: In Sung Koh, Anyang-si (KR); Sang Kwon Lee, Yongin-si (KR)

(73) Assignee: SK HYNIX INC., Icheon-si (KR)

( * ) Notice: Subject to any disclaimer, the term of this patent is extended or adjusted under 35 U.S.C. 154(b) by 0 days.

(21) Appl. No.: 15/041,728

(22) Filed: Feb. 11, 2016

(30) Foreign Application Priority Data

Sep. 17, 2015 (KR) .................. 10-2015-0131525

(51) Int. Cl.
*G11C 7/22* (2006.01)
*G11C 7/12* (2006.01)
*G11C 8/10* (2006.01)
*G11C 8/18* (2006.01)

(52) U.S. Cl.
CPC .................. *G11C 7/12* (2013.01); *G11C 8/10* (2013.01); *G11C 8/18* (2013.01)

(58) Field of Classification Search
USPC ....................................... 365/191
See application file for complete search history.

(56) References Cited

U.S. PATENT DOCUMENTS

| 2008/0159041 A1* | 7/2008 | Okuda ................. G11C 11/406 365/222 |
| 2013/0283001 A1* | 10/2013 | Ishikawa ................. G11C 7/22 711/167 |
| 2016/0179377 A1* | 6/2016 | Yoon ....................... G06F 3/061 711/154 |

FOREIGN PATENT DOCUMENTS

KR          1020150062438 A    6/2015

* cited by examiner

*Primary Examiner* — Huan Hoang
*Assistant Examiner* — Minh Dinh
(74) *Attorney, Agent, or Firm* — William Park & Associates Ltd.

(57) ABSTRACT

A semiconductor system includes a first semiconductor device and a second semiconductor device. The first semiconductor device outputs command/address signals and a plurality of data. The second semiconductor device generates a first mode signal and a second mode signal according to a combination of the command/address signals. The second semiconductor device is suitable for inverting the plurality of data inputted through a pad in response to the first or the second mode signal to store the inverted data suitable for blocking input of the inverted data in response to the second mode signal if a number of bits having a predetermined level in the plurality of data is equal to or greater than a predetermined number.

20 Claims, 6 Drawing Sheets

SEMICONDUCTOR DEVICES AND SEMICONDUCTOR SYSTEMS INCLUDING THE SAME

CROSS-REFERENCE TO RELATED APPLICATIONS

The present application claims priority under 35 U.S.C 119(a) to Korean Patent Application No. 10-2015-0131525, filed on Sep. 17, 2015, in the Korean Intellectual Property Office, which is incorporated herein by reference in its entirety as set forth in full.

BACKGROUND

1. Technical Field

Embodiments of the invention relate to semiconductor devices performing a data bus inversion (DBI) operation and a data masking (DM) operation and semiconductor systems including the same.

2. Related Art

In a semiconductor system including a controller and a semiconductor device, a read operation or a write operation may be performed by transmission of data between the controller and the semiconductor device. During the read operation, data stored in the semiconductor device may be transmitted to the controller. During the write operation, data outputted from the controller may be transmitted to the semiconductor device and may be stored in a memory area of the semiconductor device. A data masking (DM) operation may be used to store only desired bits among bits of the data outputted from the controller into the memory portion of the semiconductor device. That is, if the DM operation is performed, the semiconductor system may store only desired bits among the data outputted from the controller in the semiconductor device or may prohibit the desired bits among the data from being stored in the semiconductor device.

Meanwhile, if the number of data bits whose phases are changed when the data are transmitted in the semiconductor system increases, a simultaneous switching noise (SSN) phenomenon and an inter-symbol interface (ISI) phenomenon may occur more frequently. Thus, a data bus inversion (DBI) scheme has been used to suppress the SSN phenomenon and the ISI phenomenon. In the event that data outputted from the controller are transmitted to the semiconductor using the DBI scheme, the data have to be transmitted together with a DBI signal including information on whether the data are inverted.

SUMMARY

According to an embodiment, a semiconductor system includes a first semiconductor device and a second semiconductor device. The first semiconductor device outputs command/address signals and a plurality of data. The second semiconductor device generates a first mode signal and a second mode signal according to a combination of the command/address signals. The second semiconductor device is suitable for inverting the plurality of data inputted through a pad in response to the first or the second mode signal to store the inverted data suitable for blocking input of the inverted data in response to the second mode signal if a number of bits having a predetermined level in the plurality of data is equal to or greater than a predetermined number.

According to an embodiment, a semiconductor system includes a first semiconductor device and a second semiconductor device. The first semiconductor device outputs command/address signals, a plurality of first data and a plurality of second data. The second semiconductor device generates a first mode signal and a second mode signal according to a combination of the command/address signals. The second semiconductor device is suitable for inverting the plurality of first data inputted through a first pad and the plurality of second data inputted through a second pad to store the plurality of inverted first and second data in response to the first or second mode signal or suitable for blocking input of the plurality of inverted first and second data if a number of bits having a predetermined level in the plurality of first or second data is equal to or greater than a predetermined number in response to the second mode signal.

According to an embodiment, a semiconductor device includes a mode signal generation circuit and a first data input circuit. The mode signal generation circuit is suitable for generating a first mode signal and a second mode signal according to a combination of command/address signals. The first data input circuit is suitable for inversely buffering a plurality of first data inputted through a first pad in response to the first or second mode signal to output the inversely buffered first data to first input/output (I/O) lines or suitable for blocking input of the plurality of first data if a number of bits having a predetermined level in the plurality of first data is equal to or greater than a predetermined number.

According to an embodiment, a semiconductor device includes a mode signal generation circuit, a masking signal generation circuit and a data input circuit. The mode signal generation circuit is suitable for generating a first mode signal and a second mode signal according to a combination of command/address signals. The masking signal generation circuit is suitable for generating a masking signal which is enabled if a number of bits having a predetermined level in a plurality of data inputted through a pad is equal to or greater than a predetermined number in response to the second mode signal. The data input circuit is suitable for inversely buffering the plurality of data in response to the first or second mode signal to output the inversely buffered data to input/output (I/O) lines or suitable for blocking input of the plurality of data in response to the masking signal.

DETAILED DESCRIPTION

Various embodiments of the invention will be described hereinafter with reference to the accompanying figures. However, the embodiments described herein are for illustrative purposes only and are not intended to limit the scope of the invention. Various embodiments are directed to semiconductor devices and semiconductor systems performing a DBI operation and a DM operation.

Figure 1:
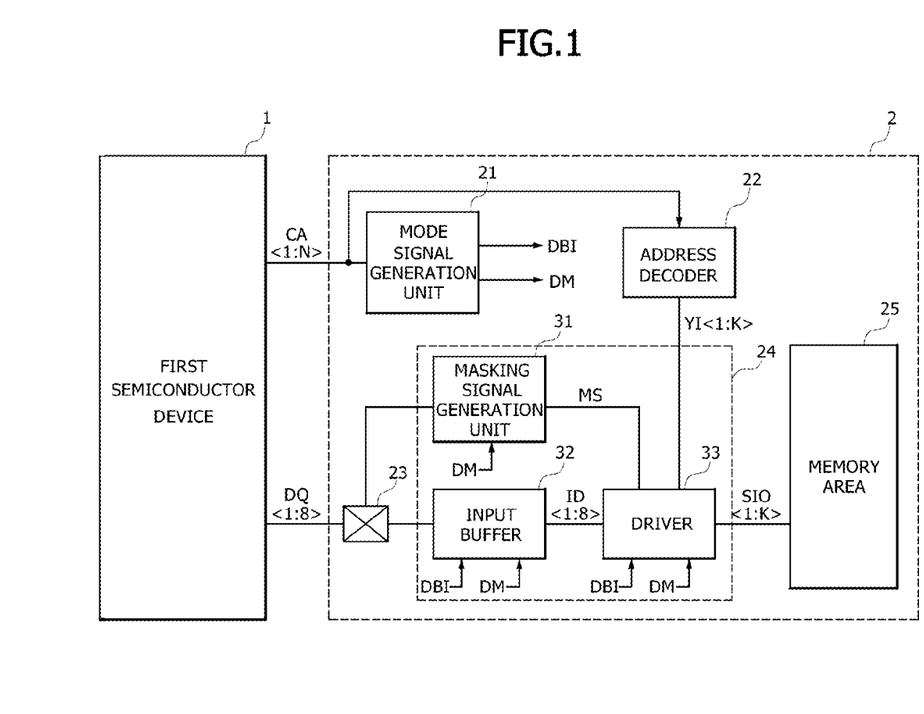
FIG. 1 is a block diagram illustrating a configuration of a semiconductor system according to an embodiment of the invention.

Referring to FIG. 1, a semiconductor system according to an embodiment may include a first semiconductor device 1 and a second semiconductor device 2. The second semiconductor device 2 may include a mode signal generation unit 21, an address decoder 22, a pad 23, a data input unit 24, and a memory area 25. The first semiconductor device 1 and second semiconductor device 2 may be configured as circuits or the like.

The first semiconductor device 1 may output command/address signals CA<1:N> and a plurality of data DQ<1:8>. The first semiconductor device 1 may receive data outputted from the second semiconductor device 2. The command/address signals CA<1:N> may be transmitted through lines that transmit at least one group of addresses, commands, and data. Alternatively, the command/address signals CA<1:N> may be successively transmitted through a single line. The command/address signals CA<1:N> may include commands for generating a first mode signal DBI and a second mode signal DM. The command/address signals CA<1:N> may include an address for selecting a memory cell included in the memory area 25. The plurality of data DQ<1:8> are illustrated as a signal including eight bits. However, the number of bits included in the plurality of data DQ<1:8> may be set to be different according to the embodiments. The plurality of data DQ<1:8> may be transmitted through lines that transmit at least one group of addresses, commands, and data. Alternatively, the plurality of data DQ<1:8> may be successively transmitted through a single line. The first semiconductor device 1 may be realized using a controller for controlling operations of the second semiconductor device 2 or a test equipment for testing the second semiconductor device 2.

The mode signal generation unit 21 may generate the first mode signal DBI and the second mode signal DM in accordance with a combination of the command/address signals CA<1:N>. The mode signal generation unit 21 may generate the first mode signal DBI if the combination of the command/address signals CA<1:N> is a first combination. The mode signal generation unit 21 may generate the second mode signal DM if the combination of the command/address signals CA<1:N> is a second combination. The mode signal generation unit 21 may generate the first mode signal DBI using some bits of the command/address signals CA<1:N> and may generate the second mode signal DM using the other bits of the command/address signals CA<1:N>. The first mode signal DBI may be set to be enabled for a DBI operation that inverts logic levels of a plurality of data that are inputted through one pad. The second mode signal DM may be set to be enabled for a DM operation that blocks input of a plurality of data that are inputted through one pad.

The address decoder 22 may decode the command/address signals CA<1:N> to generate column selection signals YI<1:K>. The column selection signals YI<1:K> may be set to a signal for selecting input/output (I/O) lines SIO<1:K> which are electrically coupled to memory cells included in the memory area 25.

The data input unit 24 may include a masking signal generation unit 31, an input buffer 32, and a driver 33.

The masking signal generation unit 31 may generate a masking signal MS which is enabled if the number of bits having a predetermined level in the plurality of data DQ<1:8> inputted through the pad 23 is equal to or greater than a predetermined number in response to the second mode signal DM. The predetermined level may be set to any one of a logic high level and a logic low level in accordance with the embodiments. The predetermined number may be set to the number of a logic high level or a logic low level among the logic levels of bits of the plurality of data DQ<1:8>. For example, if the predetermined level is set to a logic high level and the predetermined number is set to five, it means that five bits of the plurality of data DQ<1:8> have a logic high level.

The input buffer 32 may inversely buffer the plurality of data DQ<1:8> inputted through the pad 23 to generate a plurality of internal data ID<1:8>in response to the first mode signal DBI or the second mode signal DM. The input buffer 32 may inversely buffer the plurality of data DQ<1:8> to generate the plurality of internal data ID<1:8> if the first mode signal DBI is enabled. The input buffer 32 may also inversely buffer the plurality of data DQ<1:8> to generate the plurality of internal data ID<1:8> if the second mode signal DM is enabled.

The driver 33 may output the plurality of internal data ID<1:8> to the I/O lines SIO<1:K> which are selected by the column selection signals YI<1:K> in response to the first mode signal DBI or the second mode signal DM. The driver 33 may output the plurality of internal data ID<1:8> to the I/O lines SIO<1:K> which are selected by the column selection signals YI<1:K> if the first mode signal DBI is enabled. The driver 33 may also output the plurality of internal data ID<1:8> to the I/O lines SIO<1:K> which are selected by the column selection signals YI<1:K> if the second mode signal DM is enabled. The driver 33 may block the input of the plurality of internal data ID<1:8> if the masking signal MS is enabled.

The data input unit 24 may inversely buffer the plurality of data DQ<1:8> in response to the first mode signal DBI or the second mode signal DM to output the inversely buffered data to the I/O lines SIO<1:K> or may block the input of the plurality of data DQ<1:8> if the number of bits having a predetermined level in the plurality of data DQ<1:8>is equal to or greater than a predetermined number.

The memory area 25 may store the plurality of internal data ID<1:8> on the I/O lines SIO<1:K>therein during a write operation and may output the plurality of internal data ID<1:8> stored therein during a read operation. The plurality of internal data ID<1:8> outputted from the memory area 25 during the read operation may be transmitted to the first semiconductor device 1.

Figure 2:
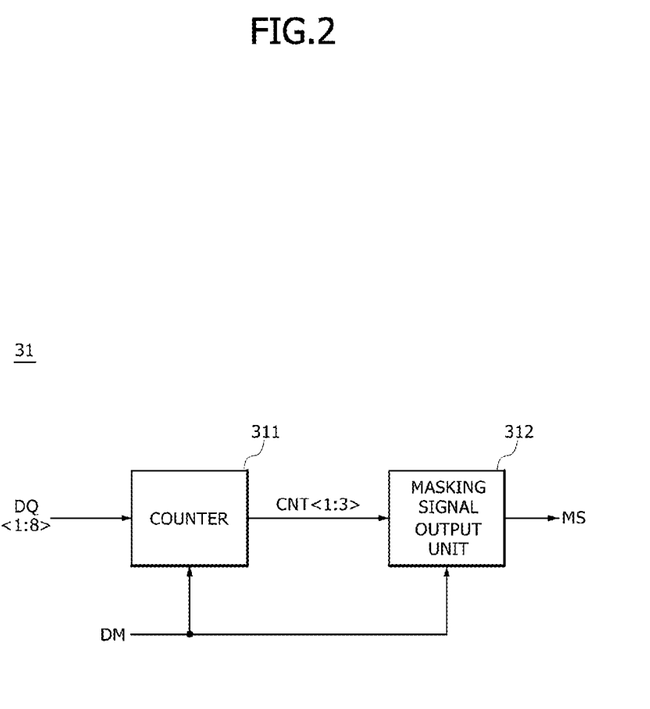
FIG. 2 is a block diagram illustrating a configuration of a masking signal generation unit included in the semiconductor system of FIG. 1.

Referring to FIG. 2, the masking signal generation unit 31 may include a counter 311 and a masking signal output unit 312.

The counter 311 may count the bits having a logic high level in the plurality of data DQ<1:8> in response to the second mode signal DM to generate the first to third counting signals CNT<1:3>. For example, the counter 311 may generate the first to third counting signals CNT<1:3> which are counted up whenever the number of bits having a logic high level in the plurality of data DQ<1:8> increases if the second mode signal DM is enabled. In some other embodiments, the counter 311 may generate the first to third counting signals CNT<1:3> by counting the number of bits having a logic low level in the plurality of data DQ<1:8> if the second mode signal DM is enabled. The counter 311 may generate the first to third counting signals CNT<1:3> which are counted up whenever the number of bits having a logic low level in the plurality of data DQ<1:8> increases.

The masking signal output unit 312 may generate the masking signal MS which is enabled if the first to third counting signals CNT<1:3> are counted by at least a predetermined number of times in response to the second mode signal DM.

The masking signal generation unit 31 may generate the masking signal MS which is enabled if the number of bits having a predetermined level in the plurality of data DQ<1:8> inputted through the pad 23 is equal to or greater than a predetermined number in response to the second mode signal DM.

An operation of the masking signal generation unit 31 will be described more fully hereinafter in conjunction with an example in which the number of bits having a logic high level in the plurality of data DQ<1:8> is five, the predetermined level is set to be a logic high level, and the predetermined number is set to be five.

The counter 311 may count up the number of bits having a logic high level in the plurality of data DQ<1:8> in response to the second mode signal DM to generate the first to third counting signals CNT<1:3>. At this time, the first to third counting signals CNT<1:3>having an initial combination of "L,L,L" may be counted up to have a final combination of "H,L,H". The combination of "L,L,L" of the first to third counting signals CNT<1:3> means that the first counting signal CNT<1>has a logic low level, the second counting signal CNT<2>has a logic low level, and the third counting signal CNT<3>has a logic low level. In addition, the combination of "H,L,H" of the first to third counting signals CNT<1:3> means that the first counting signal CNT<1>has a logic high level, the second counting signal CNT<2>has a logic low level, and the third counting signal CNT<3>has a logic high level.

The masking signal output unit 312 may generate the masking signal MS which is enabled to have a logic high level because the first to third counting signals CNT<1:3> are counted by at least the predetermined number of times in response to the second mode signal DM. A case in which the first to third counting signals CNT<1:3> are counted by at least the predetermined number of times indicates that the predetermined number is set to five and the first to third counting signals CNT<1:3> are counted up five times.

Figure 3:
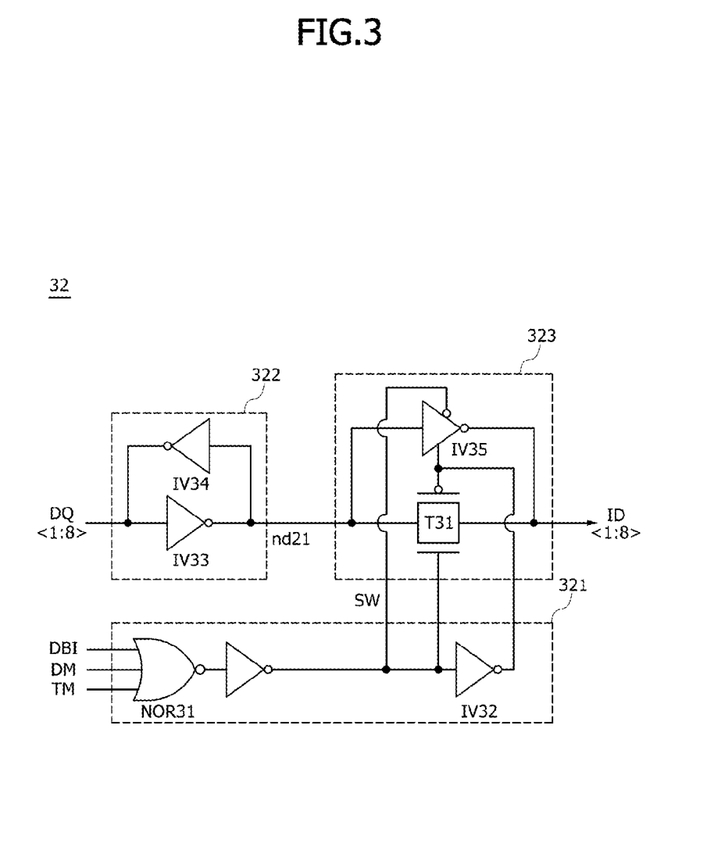
FIG. 3 is a circuit diagram illustrating a configuration of an input buffer included in the semiconductor system of FIG. 1.

Referring to FIG. 3, the input buffer 32 may include a switching signal generation unit 321, a latch unit 322, and a transfer unit 323.

The switching signal generation unit 321 may be realized to include a NOR gate NOR31, an inverter IV31 electrically coupled to an output terminal of the NOR gate NOR31, and an inverter IV32 electrically coupled to an output terminal of the inverter IV31. The switching signal generation unit 321 may generate a switching signal SW which is enabled and outputted through the output terminal of the inverter IV31 if at least one of the first mode signal DBI, the second mode signal DM and a test mode signal TM is inputted to the NOR gate NOR31. For example, the switching signal generation unit 321 may generate the switching signal SW having a logic high level, if at least one of the first mode signal DBI, the second mode signal DM and the test mode signal TM is enabled to have a logic high level. The test mode signal TM may be set to be a signal that periodically toggles to repeatedly perform operations of inversely buffering and buffering the plurality of data DQ<1:8> during a test mode.

The latch unit 322 may be realized to include a pair of cross-coupled inverters IV33 and IV34. The latch unit 322 may latch the plurality of data DQ<1:8> and may inversely buffer the plurality of data DQ<1:8> to output the inversely buffered data to an internal node nd21.

The transfer unit 323 may be realized to include a transfer gate T31 and an inverter IV35 that are electrically coupled in parallel. The transfer unit 323 may inversely buffer or buffer a signal of the internal node nd21 in response to the switching signal SW to generate the plurality of internal data ID<1:8>. For example, the transfer unit 323 may inversely buffer the signal of the internal node nd21 to output the inversely buffered signal as the plurality of internal data ID<1:8> if the switching signal SW has a logic low level and; may buffer the signal of the internal node nd21 to output the buffered signal as the plurality of internal data ID<1:8> if the switching signal SW has a logic high level.

The input buffer 32 may inversely buffer the plurality of data DQ<1:8> inputted through the pad 23 to generate the plurality of internal data ID<1:8> if the first mode signal DBI or the second mode signal DM is enabled. The input buffer 32 may repeatedly perform operations of inversely buffering and buffering the plurality of data DQ<1:8> to generate the plurality of internal data ID<1:8> if the test mode signal TM is a toggling signal.

Operations of the semiconductor system having the aforementioned configuration will be described hereinafter in conjunction with an example in which a DBI operation is executed and an example in which a DM operation is executed during the DBI operation.

First, an operation of the semiconductor system accompanying the DBI operation will be described.

The first semiconductor device 1 may output the command/address signals CA<1:N> and the plurality of data DQ<1:8>. The command/address signals CA<1:N> may be outputted to have a first combination for performing the DBI operation.

The mode signal generation unit 21 may generate the first mode signal DBI enabled to have a logic high level and the second mode signal DM disabled to have a logic low level in accordance with the command/address signals CA<1:N>.

The address decoder 22 may decode the command/address signals CA<1:N> to generate the column selection signals YI<1:K>.

The masking signal generation unit 31 of the data input unit 24 may not generate the masking signal MS in response to the second mode signal DM having a logic low level.

The input buffer 32 may inversely buffer the plurality of data DQ<1:8> inputted through the pad 23 in response to the first mode signal DBI having a logic high level to generate the plurality of internal data ID<1:8>.

The driver 33 may output the plurality of internal data ID<1:8> to the I/O lines SIO<1:K> which are selected by the column selection signals YI<1:K> in response to the first mode signal DBI having a logic high level.

The memory area 25 may store the plurality of internal data ID<1:8>loaded on the I/O lines SIO<1:K>therein during a write operation and may output the plurality of internal data ID<1:8> stored therein through the I/O lines SIO<1:K>during a read operation.

Next, an operation of the semiconductor system accompanying the DM operation executed during the DBI operation will be described. In such a case, it is assumed that the predetermined level for generating the masking signal MS using the plurality of data DQ<1:8> is set to be a logic high level, the predetermined number is set to be five, and the number of bits having a logic high level in the plurality of data DQ<1:8> is six.

The first semiconductor device 1 may output the command/address signals CA<1:N> and the plurality of data DQ<1:8>. The command/address signals CA<1:N> may be outputted to have a second combination for performing the DM operation.

The mode signal generation unit 21 may generate the first mode signal DBI disabled to have a logic low level and the second mode signal DM enabled to have a logic high level in accordance with the command/address signals CA<1:N>.

The address decoder 22 may decode the command/address signals CA<1:N> to generate the column selection signals YI<1:K>.

Since the number of bits having a logic high level in the plurality of data DQ<1:8> inputted through the pad 23 is six, the masking signal generation unit 31 of the data input unit 24 may generate the masking signal MS which is enabled to a logic high level in response to the second mode signal DM having a logic high level.

The input buffer 32 of the data input unit 24 may inversely buffer the plurality of data DQ<1:8> inputted through the pad 23 to generate the plurality of internal data ID<1:8> in response to the second mode signal DM having a logic high level.

The driver 33 of the data input unit 24 may block the input of the plurality of internal data ID<1:8> in response to the masking signal MS having a logic high level.

Since the plurality of internal data ID<1:8> are not transmitted to the I/O lines SIO<1:K>, the plurality of internal data ID<1:8> may not be written into the memory area 25.

The semiconductor system described above may detect levels of the data during the DBI operation to determine execution or no execution of the DM operation. Accordingly, an unnecessary latch circuit is not used to reduce an area and current consumption of the semiconductor system. In addition, according to an embodiment, data may be inputted and outputted by the DBI operation and the DM operation. Thus, it may be possible to reduce the simultaneous switching noise (SSN) and the inter symbol interface (ISI).

Figure 4:
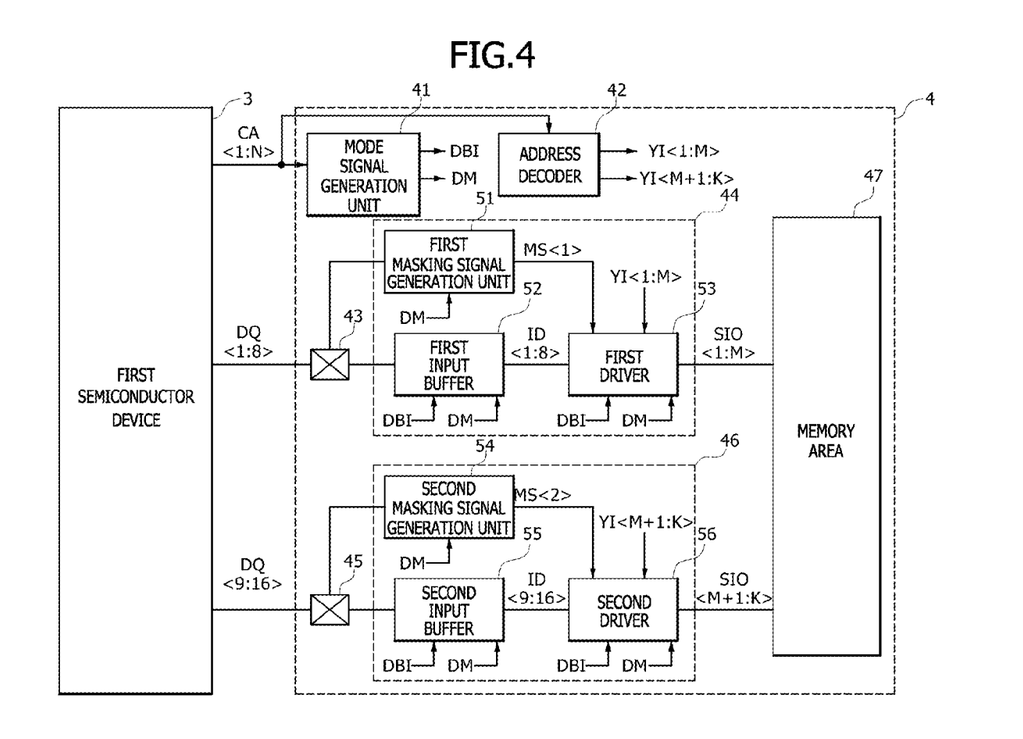
FIG. 4 is a block diagram illustrating a configuration of a semiconductor system according to an embodiment of the invention.

Referring to FIG. 4, a block diagram illustrating a configuration of a semiconductor system according to an embodiment of the invention is described.

As illustrated in FIG. 4, a semiconductor system according to an embodiment may include a first semiconductor device 3 and a second semiconductor device 4. The second semiconductor device 4 may include a mode signal generation unit 41, an address decoder 42, a first pad 43, a first data input unit 44, a second pad 45, a second data input unit 46, and a memory area 47.

The first semiconductor device 3 may output command/address signals CA<1:N>, a plurality of first data DQ<1:8>, and a plurality of second data DQ<9:16>. The first semiconductor device 3 may receive the data outputted from the second semiconductor device 4. The command/address signals CA<1:N> may be transmitted through lines that transmit at least one group of addresses, commands, and data. Alternatively, the command/address signals CA<1:N> may be successively transmitted through a single line. The command/address signals CA<1:N> may include commands for generating a first mode signal DBI and a second mode signal DM. The command/address signals CA<1:N> may include an address for selecting a memory cell included in the memory area 47. The plurality of first data DQ<1:8> are illustrated to include eight bits, but the number of bits included in the plurality of first data DQ<1:8> may be set to different according to the embodiments. Similarly, the plurality of second data DQ<9:16> are illustrated to include eight bits, but the number of bits included in the plurality of second data DQ<9:16> may be set to different according to the embodiments. The plurality of first data DQ<1:8> may be transmitted through lines that transmit at least one group of addresses, commands, and data, and the plurality of second data DQ<9:16> may also be transmitted through lines that transmit at least one group of addresses, commands, and data. Alternatively, the plurality of first data DQ<1:8> may be successively transmitted through a single line, and the plurality of second data DQ<9:16> may also be successively transmitted through a single line. The first semiconductor device 3 may be realized using a controller for controlling an operation of the second semiconductor device 4 or a test equipment for testing the second semiconductor device 4.

The mode signal generation unit 41 may generate a first mode signal DBI and a second mode signal DM in accordance with a combination of the command/address signals CA<1:N>. The mode signal generation unit 41 may generate the first mode signal DBI if the combination of the command/address signals CA<1:N> is a first combination and may generate the second mode signal DM if the combination of the command/address signals CA<1:N> is a second combination. The mode signal generation unit 41 may generate the first mode signal DBI using some bits of the command/address signals CA<1:N> and may generate the second mode signal DM using the other bits of the command/address signals CA<1:N>. The first mode signal DBI may be set to a signal which is enabled for a DBI operation that inverts levels of a plurality of data inputted through one pad. The second mode signal DM may be set to a signal which is enabled for a DM operation that blocks the input of a plurality of data inputted through one pad.

The address decoder 42 may decode the command/address signals CA<1:N> to generate first column selection signals YI<1:M> and second column selection signals YI<M+1:K>. The first column selection signals YI<1:M> may be set to signals for selecting first I/O lines SIO<1:M> which are electrically coupled to memory cells included in the memory area 47. The second column selection signals YI<M+1:K> may be set to signals for selecting second I/O lines SIO<M+1:K> which are electrically coupled to memory cells included in the memory area 47.

The first data input unit 44 may include a first masking signal generation unit 51, a first input buffer 52, and a first driver 53.

The first masking signal generation unit 51 may generate a first masking signal MS<1> which is enabled if the number of bits having a predetermined level in the plurality of first data DQ<1:8> inputted through the first pad 43 is equal to or greater than a predetermined number in response to the second mode signal DM. The predetermined level may be set to one of a logic high level and a logic low level. The predetermined number may be set to be the number of logic high levels or logic low levels of the bits of the plurality of first data DQ<1:8>. The first masking signal generation unit 51 may be realized to have the same configuration as the masking signal generation unit 31 illustrated in FIG. 1. Thus, a detailed description of the first masking signal generation unit 51 will be omitted hereinafter.

The first input buffer 52 may inversely buffer the plurality of first data DQ<1:8> inputted through the first pad 43 in response to the first mode signal DBI or the second mode signal DM to generate the plurality of first internal data ID<1:8>. The first input buffer 52 may be realized to have the same configuration as the input buffer 32 illustrated in FIG. 1. Thus, a detailed description of the first input buffer 52 will be omitted hereinafter.

The first driver 53 may output the plurality of first internal data ID<1:8> to the first I/O lines SIO<1:M> which are selected by the first column selection signals YI<1:M> in response to the first mode signal DBI or the second mode signal DM. The first driver 53 may block the input of the plurality of first internal data ID<1:8> if the first masking signal MS<1> is enabled.

The first data input unit 44 may inversely buffer the plurality of first data DQ<1:8> in response to the first mode signal DBI or the second mode signal DM to output the inversely buffered first data to the first I/O lines SIO<1:M>; or may block the input of the plurality of first data DQ<1:8> if the number of bits having the predetermined level in the plurality of first data DQ<1:8> is equal to or greater than the predetermined number.

The second data input unit 46 may include a second masking signal generation unit 54, a second input buffer 55, and a second driver 56.

The second masking signal generation unit 54 may generate a second masking signal MS<2> which is enabled if the number of bits having with a predetermined level in the plurality of second data DQ<9:16> inputted through the second pad 45 is equal to or greater than a predetermined number in response to the second mode signal DM. The predetermined level may be set to one of a logic high level or a logic low level. The predetermined number may be set to the number of logic high levels or logic low levels of the bits of the plurality of second data DQ<9:16>. The second masking signal generation unit 54 may be realized to have the same configuration as the masking signal generation unit 31 illustrated in FIG. 1. Thus, a detailed description of the second masking signal generation unit 54 will be omitted hereinafter.

The second input buffer 55 may inversely buffer the plurality of second data DQ<9:16> inputted through the second pad 45 in response to the first mode signal DBI or the second mode signal DM to generate the plurality of second internal data ID<9:16>. The second input buffer 55 may be realized to have the same configuration as the input buffer 32 illustrated in FIG. 1. Thus, a detailed description of the second input buffer 55 will be omitted hereinafter.

The second driver 56 may output the plurality of second internal data ID<9:16> to the second I/O lines SIO<M+1:K> which are selected by the second column selection signals YI<M+1:K> in response to the first mode signal DBI or the second mode signal DM. The second driver 56 may block the input of the plurality of second internal data ID<9:16> if the second masking signal MS<2> is enabled.

The second data input unit 46 may inversely buffer the plurality of second data DQ<9:16> in response to the first mode signal DBI or the second mode signal DM to output the inversely buffered second data to the second I/O lines SIO<M+1:K>; or may block the input of the plurality of second data DQ<9:16> if the number of bits having a predetermined level in the plurality of second data DQ<9:16> is equal to or greater than a predetermined number.

The memory area 47 may store the plurality of first internal data ID<1:8> loaded on the first I/O lines SIO<1:M> and the plurality of second internal data ID<9:16> loaded on the second I/O lines SIO<M+1:K> therein during a write operation. The memory area 47 may output the plurality of first internal data ID<1:8> and the plurality of second internal data ID<9:16> stored therein through the first I/O lines SIO<1:M> and the second I/O lines SIO<M+1:K> during a read operation. The plurality of first internal data ID<1:8> and the plurality of second internal data ID<9:16> outputted from the memory area 47 may be transmitted to the first semiconductor device 3 during the read operation.

The semiconductor system described above may detect levels of the data during the DBI operation to determine execution or no execution of the DM operation. Accordingly, an unnecessary latch circuit is not used to reduce an area and current consumption of the semiconductor system. In addition, according to an embodiment, data may be inputted and outputted by the DBI operation and the DM operation. Thus, it may be possible to reduce the simultaneous switching noise (SSN) and the inter symbol interface (ISI).

Figure 5:
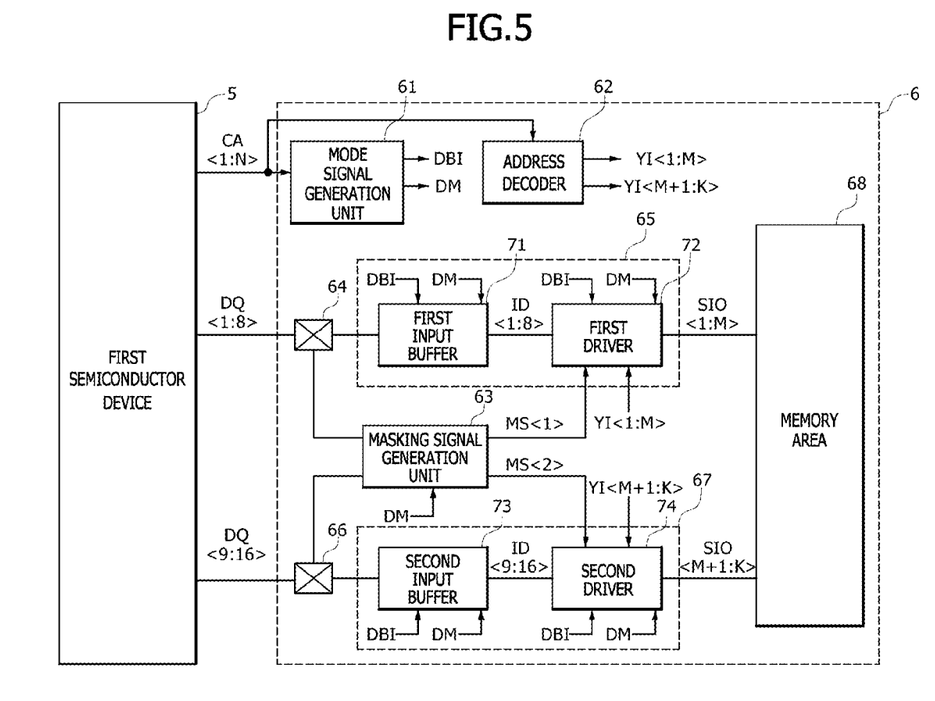
FIG. 5 is a block diagram illustrating a configuration of a semiconductor system according to an embodiment of the invention.

Referring to FIG. 5, a semiconductor system according to an embodiment may include a first semiconductor device 5 and a second semiconductor device 6. The second semiconductor device 6 may include a mode signal generation unit 61, an address decoder 62, a masking signal generation unit 63, a first pad 64, a first data input unit 65, a second pad 66, a second data input unit 67, and a memory area 68.

The first semiconductor device 5 may output command/address signals CA<1:N>, a plurality of first data DQ<1:8>, and a plurality of second data DQ<9:16>. The first semiconductor device 5 may receive the data outputted from the second semiconductor device 6. The command/address signals CA<1:N> may be transmitted through lines that transmit at least one group of addresses, commands, and data. Alternatively, the command/address signals CA<1:N> may be successively transmitted through a single line. The command/address signals CA<1:N> may include commands for generating a first mode signal DBI and a second mode signal DM. The command/address signals CA<1:N> may include an address for selecting a memory cell included in the memory area 68. The plurality of first data DQ<1:8> are illustrated to include eight bits, but the number of bits included in the plurality of first data DQ<1:8> may be set to be different according to the embodiments. Similarly, the plurality of second data DQ<9:16> are illustrated to include eight bits, but the number of bits included in the plurality of second data DQ<1:8> may be set to be different according to the embodiments. The plurality of first data DQ<1:8> may be transmitted through lines that transmit at least one group of the addresses, commands, and data, and the plurality of second data DQ<9:16> may also be transmitted through lines that transmit at least one group of the addresses, commands, and data. Alternatively, the plurality of first data DQ<1:8> may be successively transmitted through a single line. Further, the plurality of second data DQ<9:16> may also be successively transmitted through a single line. The first semiconductor device 5 may be realized using a controller for controlling an operation of the second semiconductor device 6 or a test equipment for testing the second semiconductor device 6.

The mode signal generation unit 61 may generate a first mode signal DBI and a second mode signal DM in accordance with a combination of the command/address signals CA<1:N>. The mode signal generation unit 61 may generate the first mode signal DBI if the combination of the command/address signals CA<1:N> is a first combination. The mode signal generation unit 61 may generate the second mode signal DM if the combination of the command/address signals CA<1:N> is a second combination. The mode signal generation unit 61 may generate the first mode signal DBI using some bits of the command/address signals CA<1:N> and may generate the second mode signal DM using the other bits of the command/address signals CA<1:N>. The first mode signal DBI may be set to a signal which is enabled for a DBI operation that inverts levels of a plurality of data inputted through one pad. The second mode signal DM may be set to a signal which is enabled for a DM operation that blocks the input of a plurality of data inputted through one pad.

The address decoder 62 may decode the command/address signals CA<1:N> to generate first column selection signals YI<1:M> and second column selection signals YI<M+1:K>. The first column selection signals YI<1:M> may be set to signals for selecting first I/O lines SIO<1:M>which are electrically coupled to memory cells included in the memory area 68. The second column selection signals YI<M+1:K> may be set to signals for selecting second I/O lines SIO<M+1:K>which are electrically coupled to memory cells included in the memory area 68.

The masking signal generation unit 63 may generate a first masking signal MS<1> which is enabled if the number of bits having a predetermined level in the plurality of first data DQ<1:8> inputted through the first pad 64 is equal to or greater than a predetermined number in response to the second mode signal DM. The masking signal generation unit 63 may generate a second masking signal MS<2> which is enabled if the number of bits having a predetermined level in the plurality of second data DQ<9:16> inputted through the second pad 66 is equal to or greater than a predetermined number in response to the second mode signal DM. The predetermined level may be set to one of a logic high level and a logic low level. The predetermined number may be set to the number of logic high levels or logic low levels of the plurality of first data DQ<1:8> and the plurality of second data DQ<9:16>. The masking signal generation unit 63 may be realized to have the same configuration as the masking signal generation unit 31 illustrated in FIG. 1, except for only the input and output signals. Hence, a detailed description of the masking signal generation unit 63 will be omitted hereinafter.

The first data input unit 65 may include a first input buffer 71 and a first driver 72.

The first input buffer 71 may inversely buffer the plurality of first data DQ<1:8> inputted through the first pad 43 in response to the first mode signal DBI or the second mode signal DM to generate a plurality of first internal data ID<1:8>. The first input buffer 71 may be realized to have the same configuration as the input buffer 32 illustrated in FIG. 1. Thus, a detailed description of the first input buffer 71 will be omitted hereinafter.

The first driver 72 may output the plurality of first internal data ID<1:8> to the first I/O lines SIO<1:M> which are selected by the first column selection signals YI<1:M> in response to the first mode signal DBI or the second mode signal DM. The first driver 72 may block the input of the plurality of first internal data ID<1:8> if the first masking signal MS<1> is enabled.

The first data input unit 65 may inversely buffer the plurality of first data DQ<1:8> in response to the first mode signal DBI or the second mode signal DM to output the inversely buffered first data to the first I/O lines SIO<1:M>; or may block the input of the plurality of first data DQ<1:8> if the number of bits having a predetermined level in the plurality of first data DQ<1:8>is equal to or greater than a predetermined number.

The second data input unit 67 may include a second input buffer 73 and a second driver 74.

The second input buffer 73 may inversely buffer the plurality of second data DQ<9:16> inputted through the second pad 66 in response to the first mode signal DBI or the second mode signal DM to generate a plurality of second internal data ID<9:16>. The second input buffer 73 may be realized to have the same configuration as the input buffer 32 illustrated in FIG. 1. Thus, a detailed description of the second input buffer 73 will be omitted hereinafter.

The second driver 74 may output the plurality of second internal data ID<9:16> to the second I/O lines SIO<M+1:K> which are selected by the second column selection signals YI<M+1:K> in response to the first mode signal DBI or the second mode signal DM. The second driver 74 may block the input of the plurality of second internal data ID<9:16> if the second masking signal MS<2> is enabled.

The second data input unit 67 may inversely buffer the plurality of second data DQ<9:16> in response to the first mode signal DBI or the second mode signal DM to output to the second I/O lines SIO<M+1:K> or may block the input of the plurality of second data DQ<9:16> if the number of bits having a predetermined level in the plurality of second data DQ<9:16>is equal to or greater than a predetermined number.

The memory area 68 may store the plurality of first internal data ID<1:8>loaded on the first I/O lines SIO<1:M> and the plurality of second internal data ID<9:16>loaded on the second I/O lines SIO<M+1:K> therein during a write operation. The memory area 68 may output the plurality of first internal data ID<1:8> and the plurality of second internal data ID<9:16> stored therein through the first I/O lines SIO<1:M> and the second I/O lines SIO<M+1:K>during a read operation. The plurality of first internal data ID<1:8> and the plurality of second internal data ID<9:16> outputted from the memory area 68 may be transmitted to the first semiconductor device 5 during the read operation.

The semiconductor system described above may detect levels of the data during the DBI operation to determine execution or no execution of the DM operation. Accordingly, an unnecessary latch circuit is not used to reduce an area and current consumption of the semiconductor system. In addition, according to an embodiment, data may be inputted and outputted by the DBI operation and the DM operation. Thus, it may be possible to reduce the simultaneous switching noise (SSN) and the inter symbol interface (ISI).

At least one of the semiconductor devices or at least one of the semiconductor systems described with reference to FIGS. 1 to 5 may be applied to an electronic system that includes a memory system, a graphic system, a computing system, a mobile system, or the like. For example, referring to FIG. 6, an electronic system 1000 according an embodiment may include a data storage unit 1001, a memory controller 1002, a buffer memory 1003, and an input/output (I/O) interface 1004.

The data storage unit 1001 may store data which are outputted from the memory controller 1002 or may read and output the stored data to the memory controller 1002 according to a control signal generated from the memory controller 1002. The data storage unit 1001 may include the second semiconductor device 2 illustrated in FIG. 1, the second semiconductor device 4 illustrated in FIG. 4, or the second semiconductor device 6 illustrated in FIG. 5. The data storage unit 1001 may include a nonvolatile memory that can retain their stored data even when its power supply is interrupted. The nonvolatile memory may be a flash memory such as a NOR-typeflash memory or a NAND-typeflash memory, a phase change random access memory (PRAM), a resistive random access memory (RRAM), a spin transfer torque random access memory (STTRAM), a magnetic random access memory (MRAM), or the like.

Figure 6:
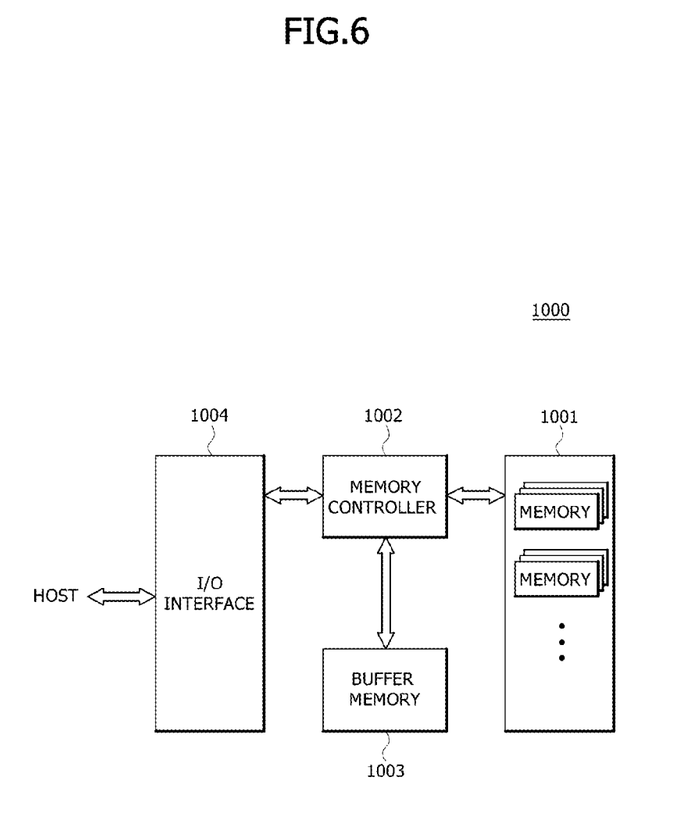
FIG. 6 is a block diagram illustrating a configuration of an electronic system including at least one of the semiconductor devices or the semiconductor systems illustrated in FIGS. 1 to 5.

The memory controller 1002 may receive a command outputted from an external device (e.g., a host device)

through the I/O interface 1004. The memory controller 1002 may decode the command outputted from the host device to control an operation for inputting data into the data storage unit 1001 or the buffer memory 1003 or for outputting the data stored in the data storage unit 1001 or the buffer memory 1003. The memory controller 1002 may include the first semiconductor device 1 illustrated in FIG. 1, the first semiconductor device 3 illustrated in FIG. 4, or the first semiconductor device 5 illustrated in FIG. 5. Although FIG. 6 illustrates the memory controller 1002 with a single block, the memory controller 1002 may include one controller for controlling the data storage unit 1001 comprised of a non-volatile memory and another controller for controlling the buffer memory 1003 comprised of a volatile memory.

The buffer memory 1003 may temporarily store the data which are processed by the memory controller 1002. The buffer memory 1003 may temporarily store the data which are outputted from or to be inputted to the data storage unit 1001. The buffer memory 1003 may store the data, which are outputted from the memory controller 1002, according to a control signal. The buffer memory 1003 may read and output the stored data to the memory controller 1002. The buffer memory 1003 may include a volatile memory such as a dynamic random access memory (DRAM), a mobile DRAM, or a static random access memory (SRAM).

The I/O interface 1004 may physically and electrically couple the memory controller 1002 to the external device (i.e., the host). Thus, the memory controller 1002 may receive control signals and data supplied from the external device (i.e., the host) through the I/O interface 1004 and may output the data generated from the memory controller 1002 to the external device (i.e., the host) through the I/O interface 1004. The electronic system 1000 may communicate with the host through the I/O interface 1004. The I/O interface 1004 may include any one of various interface protocols such as a universal serial bus (USB), a multi-media card (MMC), a peripheral component interconnect-express (PCI-E), a serial attached SCSI (SAS), a serial AT attachment (SATA), a parallel AT attachment (PATA), a small computer system interface (SCSI), an enhanced small device interface (ESDI) and an integrated drive electronics (IDE).

The electronic system 1000 may be used as an auxiliary storage device of the host or an external storage device. The electronic system 1000 may include a solid state disk (SSD), a USB memory, a secure digital (SD) card, a mini secure digital (mSD) card, a micro secure digital (micro SD) card, a secure digital high capacity (SDHC) card, a memory stick card, a smart media (SM) card, a multi-media card (MMC), an embedded multi-media card (eMMC), a compact flash (CF) card, or the like.

What is claimed is:

1. A semiconductor system comprising:
a first semiconductor device suitable for outputting command/address signals and a plurality of data; and
a second semiconductor device suitable for generating a first mode signal and a second mode signal according to a combination of the command/address signals,
wherein the second semiconductor device is suitable for inverting the plurality of data inputted through a pad in response to the first mode signal or the second mode signal to store the plurality of inverted data, and
wherein the second semiconductor device is suitable for blocking input of the plurality of inverted data in response to the second mode signal, if a number of bits having a predetermined level in the plurality of data is equal to or greater than a predetermined number.

2. The semiconductor system of claim 1,
wherein the first mode signal is enabled to perform a data bus inversion (DBI) operation that inverts the plurality of data; and
wherein the second mode signal is enabled to perform a data masking (DM) operation that blocks the input of the plurality of data.

3. The semiconductor system of claim 1, wherein the second semiconductor device includes:
a mode signal generation circuit suitable for generating the first mode signal and the second mode signal in accordance with the combination of the command/address signals; and
a data input circuit suitable for inversely buffering the plurality of data inputted through the pad in response to the first or second mode signal to output the inversely buffered data to input/output (I/O) lines or suitable for blocking the input of the plurality of data if the number of bits having the predetermined level in the plurality of data is equal to or greater than the predetermined number.

4. The semiconductor system of claim 3, wherein the data input circuit includes:
a masking signal generation circuit suitable for generating a masking signal which is enabled if the number of bits having the predetermined level in the plurality of data is equal to or greater than the predetermined number in response to the second mode signal;
an input buffer suitable for inversely buffering the plurality of data in response to the first or second mode signal to generate a plurality of internal data; and
a driver suitable for outputting the plurality of internal data to the I/O lines selected by column selection signals in response to the first or second mode signal or suitable for blocking input of the plurality of internal data in response to the masking signal.

5. The semiconductor system of claim 4, wherein the masking signal generation circuit includes:
a counter suitable for counting the number of bits having the predetermined level in the plurality of data in response to the second mode signal to generate counting signals; and
a masking signal output circuit suitable for generating the masking signal which is enabled if the counting signals are counted by at least a predetermined number of times.

6. The semiconductor system of claim 4, wherein the input buffer includes:
a switching signal generation circuit suitable for generating a switching signal which is enabled if at least one of the first mode signal, the second mode signal and a test mode signal is inputted;
a latch circuit suitable for latching the plurality of data and suitable for inversely buffering the plurality of data to output the inversely buffered data to an internal node; and
a transfer circuit suitable for inversely buffering or buffering a signal of the internal node in response to the switching signal to generate the plurality of internal data.

7. The semiconductor system of claim 3, wherein the second semiconductor device further includes:
an address decoder suitable for generating the column selection signals by decoding the command/address signals; and
a memory area suitable for storing the plurality of internal data loaded on the I/O lines during a write operation and suitable for outputting the plurality of internal data stored through the I/O lines during a read operation.

8. A semiconductor system comprising:
a first semiconductor device suitable for outputting command/address signals, a plurality of first data, and a plurality of second data; and
a second semiconductor device suitable for generating a first mode signal and a second mode signal according to a combination of the command/address signals,
wherein the second semiconductor device is suitable for inverting the plurality of first data inputted through a first pad and the plurality of second data inputted through a second pad to store the plurality of inverted first and second data in response to the first mode signal or the second mode signal, and
wherein the second semiconductor device is suitable for blocking input of the plurality of inverted first and second data if a number of bits having a predetermined level in the plurality of first or second data is equal to or greater than a predetermined number, in response to the second mode signal.

9. The semiconductor system of claim 8, wherein the first mode signal is enabled to perform a data bus inversion (DBI) operation that inverts the plurality of first and second data, and the second mode signal is enabled to perform a data masking (DM) operation that blocks the input of the plurality of first and second data.

10. The semiconductor system of claim 8, wherein the second semiconductor device includes:
a mode signal generation circuit suitable for generating the first mode signal and the second mode signal according to the combination of the command/address signals;
a first data input circuit suitable for inversely buffering the plurality of first data inputted through the first pad in response to the first or second mode signal to output the inversely buffered first data to first input/output (I/O) lines or suitable for blocking the input of the plurality of first data if the number of bits having the predetermined level in the plurality of first data is equal to or greater than the predetermined number; and
a second data input circuit suitable for inversely buffering the plurality of second data inputted through the second pad in response to the first or second mode signal to output the inversely buffered second data to second I/O lines or suitable for blocking the input of the plurality of second data if the number of bits having the predetermined level in the plurality of second data is equal to or greater than the predetermined number.

11. The semiconductor system of claim 10, wherein the first data input circuit includes:
a first masking signal generation circuit suitable for generating a first masking signal which is enabled if the number of bits having the predetermined level in the plurality of first data is equal to or greater than the predetermined number in response to the second mode signal;
a first input buffer suitable for inversely buffering the plurality of first data in response to the first or second mode signal to generate a plurality of first internal data; and
a first driver suitable for outputting the plurality of first internal data to the first I/O lines selected by first column selection signals in response to the first or second mode signal or suitable for blocking input of the plurality of first internal data in response to the first masking signal.

12. The semiconductor system of claim 11, wherein the first masking signal generation circuit includes:
a first counter suitable for counting the number of bits having the predetermined level in the plurality of first data in response to the second mode signal to generate first counting signals; and
a first masking signal output circuit suitable for generating the first masking signal which is enabled if the first counting signals are counted by at least a predetermined number of times.

13. The semiconductor system of claim 11, wherein the first input buffer includes:
a first switching signal generation circuit suitable for generating a first switching signal which is enabled if at least one of the first mode signal, the second mode signal and a test mode signal is inputted;
a first latch circuit suitable for latching the plurality of first data and suitable for inversely buffering the plurality of first data to output the inversely buffered first data to a first internal node; and
a first transfer circuit suitable for inversely buffering or buffering a signal of the first internal node in response to the first switching signal to generate the plurality of first internal data.

14. The semiconductor system of claim 11, wherein the second data input circuit includes:
a second masking signal generation circuit suitable for generating a second masking signal which is enabled if the number of bits having the predetermined level in the plurality of second data is equal to or greater than the predetermined number in response to the second mode signal;
a second input buffer suitable for inversely buffering the plurality of second data in response to the first or second mode signal to generate a plurality of second internal data; and
a second driver suitable for outputting the plurality of second internal data to the second I/O lines selected by second column selection signals in response to the first or second mode signal or suitable for blocking input of the plurality of second internal data in response to the second masking signal.

15. The semiconductor system of claim 14, wherein the second masking signal generation circuit includes:
a second counter suitable for counting the number of bits having the predetermined level in the plurality of second data in response to the second mode signal to generate second counting signals; and
a second masking signal output circuit suitable for generating the second masking signal which is enabled if the second counting signals are counted by at least a predetermined number of times.

16. The semiconductor system of claim 14, wherein the second input buffer includes:
a second switching signal generation circuit suitable for generating a second switching signal which is enabled if at least one of the first mode signal, the second mode signal and a test mode signal is inputted;
a second latch circuit suitable for latching the plurality of second data and suitable for inversely buffering the plurality of second data to output the inversely buffered second data to a second internal node; and
a second transfer circuit suitable for inversely buffering or buffering a signal of the second internal node in response to the second switching signal to generate the plurality of second internal data.

17. The semiconductor system of claim 10, wherein the second semiconductor device further includes:
- an address decoder suitable for generating first and second column selection signals by decoding the command/address signals; and
- a memory area suitable for storing a plurality of first internal data loaded on the first I/O lines and a plurality of second internal data loaded on the second I/O lines during a write operation and suitable for outputting the plurality of first and second internal data stored therein through the first and second I/O lines during a read operation.

18. A semiconductor device comprising:
- a mode signal generation circuit suitable for generating a first mode signal and a second mode signal according to a combination of command/address signals; and
- a first data input circuit suitable for inversely buffering a plurality of first data inputted through a first pad in response to the first or second mode signal to output the inversely buffered first data to first input/output (I/O) lines,
- wherein the first data input circuit is suitable for blocking input of the plurality of first data, if a number of bits having a predetermined level in the plurality of first data is equal to or greater than a predetermined number.

19. The semiconductor device of claim 18, further comprising:
- a second data input circuit suitable for inversely buffering a plurality of second data inputted through a second pad in response to the first or second mode signal to output the inversely buffered second data to second I/O lines,
- wherein the second data input circuit is suitable for blocking input of the plurality of second data, if the number of bits having the predetermined level in the plurality of second data is equal to or greater than the predetermined number.

20. A semiconductor device comprising:
- a mode signal generation circuit suitable for generating a first mode signal and a second mode signal according to a combination of command/address signals;
- a masking signal generation circuit suitable for generating a masking signal which is enabled if a number of bits having a predetermined level in a plurality of data inputted through a pad is equal to or greater than a predetermined number in response to the second mode signal; and
- a data input circuit suitable for inversely buffering the plurality of data in response to the first or second mode signal to output the inversely buffered data to input/output (I/O) lines or suitable for blocking input of the plurality of data in response to the masking signal.

* * * * *